United States Patent
Kumada et al.

(10) Patent No.: US 7,824,784 B2
(45) Date of Patent: Nov. 2, 2010

(54) COMPOSITION FOR LOW DIELECTRIC MATERIAL, LOW DIELECTRIC MATERIAL AND METHOD FOR PRODUCTION THEREOF

(75) Inventors: Teruhiko Kumada, Hyogo (JP); Hideharu Nobutoki, Neyagawa (JP); Tetsuya Yamamoto, Nishinomiya (JP); Takuya Kamiyama, Takatsuki (JP)

(73) Assignees: Mitsubishi Denki Kabushiki Kaisha, Tokyo (JP); Nippon Shokubai Co., Ltd., Osaka (JP)

( * ) Notice: Subject to any disclaimer, the term of this patent is extended or adjusted under 35 U.S.C. 154(b) by 0 days.

(21) Appl. No.: 12/327,117

(22) Filed: Dec. 3, 2008

(65) Prior Publication Data

US 2009/0090274 A1 Apr. 9, 2009

Related U.S. Application Data

(62) Division of application No. 11/000,567, filed on Dec. 1, 2004, now abandoned.

(30) Foreign Application Priority Data

| Dec. 1, 2003 | (JP) | ............................. 2003-401199 |
| Dec. 1, 2003 | (JP) | ............................. 2003-401200 |

(51) Int. Cl.
  *B05D 1/00* (2006.01)
  *B32B 9/00* (2006.01)
(52) U.S. Cl. ................... 428/704; 427/372.2
(58) Field of Classification Search ........... None
  See application file for complete search history.

(56) References Cited

U.S. PATENT DOCUMENTS

| 3,082,252 A | 3/1963 | Newsom et al. |
| 4,150,097 A | 4/1979 | Hough et al. |
| 6,458,719 B1 | 10/2002 | Tsunoda et al. |
| 6,924,240 B2 | 8/2005 | Nobutoki et al. |
| 7,029,605 B2 | 4/2006 | Tsunoda et al. |
| 2002/0058142 A1 | 5/2002 | Tsunoda et al. |
| 2003/0100175 A1 | 5/2003 | Nobutoki et al. |
| 2005/0282015 A1 | 12/2005 | Kumuda et al. |
| 2006/0110610 A1 | 5/2006 | Matsutani et al. |

FOREIGN PATENT DOCUMENTS

| JP | 2002317049 A | 4/2001 |
| JP | 2002347163 A | 12/2002 |
| JP | 2003119289 A | 4/2003 |
| JP | 2004140341 A | 5/2004 |
| JP | 2005112723 A | 4/2005 |

*Primary Examiner*—Ramsey Zacharia
(74) *Attorney, Agent, or Firm*—Porzio, Bromberg & Newman, P.C.

(57) ABSTRACT

A low dielectric material is produced by using a composition including a borazine ring-containing compound and a compound represented by the following formula as a solvent, and/or by annealing a composition comprising a borazine ring-containing compound under atmosphere of oxygen concentration not higher than 0.1 vol % at 200 to 600° C. In the following formula, $R^a$ and $R^c$ independently represent alkyl group or acyl group; $R^b$ represents hydrogen atom or alkyl group; and n represents an integer of 1 to 5.

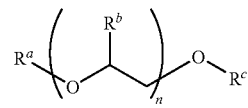

7 Claims, No Drawings

COMPOSITION FOR LOW DIELECTRIC MATERIAL, LOW DIELECTRIC MATERIAL AND METHOD FOR PRODUCTION THEREOF

CROSS-REFERENCE TO RELATED APPLICATION

This application is a divisional of U.S. patent application Ser. No. 11/000,567, now abandoned, filed Dec. 1, 2004, which claims the benefit of Application No. 2003-401199, filed in Japan on Dec. 1, 2003 and Application No. 2003-401200 filed in Japan on Dec. 1, 2003, the disclosures of which Applications are incorporated by reference into this application.

BACKGROUND OF THE INVENTION

1. Field of the Invention

The present invention relates to a composition for low dielectric material, a low dielectric material and a method for production thereof, in particular, relates to a composition for low dielectric material containing a borazine ring-containing compound and a low dielectric material prepared by using a borazine ring-containing compound. A composition for low dielectric material and a low dielectric material of the present invention is used to produce an interlayer dielectric film for semiconductor device.

2. Description of Related Art

With higher functionalization of information devices, design rule of LSI has been required to be finer year by year. In production of LSI with finer design rule, materials composing LSI should also have higher performance and fulfill function even on fine LSI.

For example, as for materials used for an interlayer dielectric film in LSI, high dielectric constant causes signal delay. In fine LSI, effects of the signal delay is particularly significant. Therefore, development of a new low dielectric material which can be used for an interlayer dielectric film has been needed. Also to be used as an interlayer dielectric film, it is necessary not only to have low dielectric constant but also superior characteristics such as humidity resistance, heat resistance, mechanical strength, etc.

As a material to respond to these requirements, a compound having borazine ring backbone has been proposed (for example, see US patent publication No. 2002-58142). A compound having borazine ring backbone has small molecular polarizability and thus a coated membrane formed provides low dielectric constant. Moreover, the coated membrane formed is superior in heat resistance. The coated membrane can be formed by spin-coating of a compound having borazine ring backbone. As a solvent used in the spin-coating, alcohols such as methanol, ethanol, propanol, butanol, etc., acetone, benzene, toluene and xylene are cited.

Further, a polymer composition containing a compound having borazine ring backbone and an organosilicon compound has been proposed (for example, see JP-2002-317049A). A coated membrane formed by using a polymer composition containing a compound having borazine ring backbone and an organosilicon compound has superior humidity resistance. The coated membrane can be formed by spin-coating of a polymer composition. As a solvent used here, ethylene glycol, ethylene glycol monomethyl ether, toluene, benzene, xylene, hexane, heptane, octane, tetrahydrofuran and tetraglyme are cited.

BRIEF SUMMARY OF THE INVENTION

As described above, a compound having borazine ring backbone is very useful as a raw material for a low dielectric material used as an interlayer dielectric film, and the like. However, further improvement is required to enhance value as a low dielectric material.

It is an object of the present invention to further enhance characteristics of a low dielectric material formed by using a compound having borazine ring backbone.

Further, there are various means to form a coated membrane (a low dielectric material) composed of a compound having borazine ring backbone, however, in view of productivity, it is preferable to use a coating method represented by a spin-coating. However, when a composition for low dielectric material containing a compound having borazine ring backbone is coated, such problems occur as white turbidity of the coated membrane and reduced membrane formability. For example, when an interlayer dielectric film for semiconductor device is inhomogeneous, it leads to defect or reduced performance of semiconductor device. That is, reduced production yield may be induced by a coated membrane thus produced, which in turn causes lowering of reliability of semiconductor device produced or competitiveness of a company.

Therefore, it is also an object of the present invention to provide means to form superior coated membrane using a coating method.

In an aspect of the invention, as a solvent included in a composition for low dielectric material containing a borazine ring-containing compound, a solvent represented by the following formula is preferably used:

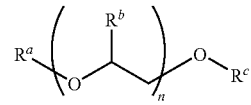

wherein $R^a$ and $R^c$ may independently represents alkyl group or acyl group; $R^b$ represents hydrogen atom or alkyl group; and n represents an integer of 1 to 5. And a low dielectric material is produced by forming a coated membrane on a substrate by spin-coating the composition containing the solvent represented by the above-described formula.

By containing a solvent represented by the above-described formula, a homogeneous coated membrane can be formed. For example, when an interlayer dielectric film for semiconductor device is formed by using a composition of the present invention, reliability of semiconductor device produced is improved. Also by using a composition for low dielectric material of the present invention, improvement of production yield of semiconductor device is expected and thus can greatly contribute in industrial mass production steps.

In another aspect of the invention, a low dielectric material is produced by annealing a composition containing a borazine ring-containing compound, preferably under atmosphere of oxygen concentration not higher than 0.1 vol % at 200 to 600° C.

By using a composition containing a compound having borazine ring, a low dielectric material having low dielectric constant is obtained. Also by controlling oxygen concentration in annealing, dielectric constant of a low dielectric material formed is further lowered. Furthermore, by controlling temperature in annealing, humidity resistance and membrane formability of a low dielectric material formed are improved.

A low dielectric material having such characteristics is particularly useful as an interlayer dielectric film in semiconductor device and a low dielectric material of the present invention greatly contributes to realization of high speed ULSI.

DETAILED DESCRIPTION OF THE INVENTION

As described above, a compound having borazine ring backbone is superior as a raw material of low dielectric material. The present inventors have studied comprehensively to further improve characteristics of a low dielectric material formed by using a compound having borazine ring backbone and have found, as the results, that annealing conditions in producing a low dielectric material have strong effects on characteristics of a low dielectric material formed and thus completed the present invention. We have also found out a preferable borazine ring-containing compound as a low dielectric material.

The present inventors have also studied comprehensively to further improve uniformity of a coated membrane composed of a borazine ring-containing compound, formed by using a coating method and have found, as the results, that by using a specified solvent as a solvent of a borazine ring-containing compound to be coated by using a coating method, uniformity of a coated membrane produced can be improved and thus completed the present invention. We have also found out a borazine ring-containing compound suitably used here.

A "borazine ring-containing compound" in the present invention means a compound having a borazine ring represented by the following formula in the structure.

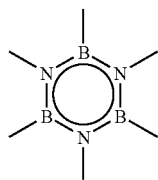

As is understood by the above formula, nitrogen (N) and boron (B) in a borazine ring each has one bond which does not form a borazine ring. An element and a functional group bonding to nitrogen and boron which form a borazine ring are not especially limited. An element and a functional group bonding to nitrogen and boron which form a borazine ring include hydrogen atom, halogen atom, alkyl group, amino group and borazinyl group.

A borazine ring-containing compound may be a compound having one borazine ring or a compound having two or more borazine rings. A borazine ring-containing compound may by a polymer. In the present application, irrespective of morphology or molecular weight of a compound, a compound as long as having a borazine ring is included in a "borazine ring-containing compound" concept. When a production step of a low dielectric material includes a coating step by spin-coating of a composition containing a compound having a borazine ring, it is preferable that a borazine ring-containing compound is a polymer. Because viscosity of a solution containing a polymer is high, it is suitable to coating using spin-coating.

A polymer as a borazine ring-containing compound can be formed by using a compound having borazine ring backbone as a monomer. A polymerization method or polymerization form is not especially limited. A polymerization method is selected by a functional group bonding to a borazine ring. For example, when amino group is bonded, a polymer can be synthesized by a polycondensation as shown in Examples. When vinyl group or a functional group containing vinyl group is bonded to a borazine ring, a polymer can be formed, for examples, by a radical polymerization using a polymerization initiator. A polymer may be a homopolymer or a copolymer containing two or more monomer units. Morphology of a copolymer may be any of a random copolymer, a bock copolymer, a graft copolymer, etc. By using a monomer having three or more functional groups formable bonds with other monomers, a polymer with monomers bonded in network structure can also be obtained.

A borazine ring-containing compound of the present invention is preferably a compound represented by the following formula (1) or a polymer thereof.

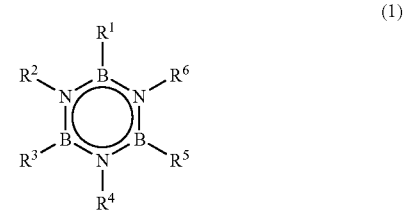

$R^1$, $R^3$ and $R^5$ bonding to boron (B) composing a borazine ring are hydrogen atom, alkyl group which may be substituted or a functional group represented by the following formula (2):

$R^1$, $R^3$ and $R^5$ may be the same or different and $R^7$ in the formula (2) is alkyl group.

Alkyl group included as $R^1$, $R^3$, $R^5$ and $R^7$ may be a straight, branched or cyclic alkyl group. As an example of alkyl group, methyl group, ethyl group, propyl group, butyl group, pentyl group, hexyl group, heptyl group, octyl group, nonyl group, decyl group, 1-methylethyl group, sec-butyl group, tert-butyl group, neopentyl group and cyclohexyl group are included. However, alkyl group included as $R^1$, $R^3$, $R^5$ and $R^7$ is not necessarily limited to these.

Alkyl group included as $R^1$, $R^3$, $R^5$ and $R^7$ may be substituted with other functional groups at their hydrogen atom as long as they do not impair the effects of the present invention. As a functional group, amino group, isocyanate group, vinyl group and ethynyl group are included.

When a functional group represented by the formula (2) is included, a borazine ring-containing compound represented by the formula (1) is suitable to be subjected to polycondensation. In this case, it is preferable that two or more functional groups represented by the formula (2) are included in a borazine ring-containing compound used as a monomer. To obtain a polymer with network structure, a borazine ring-containing compound is suitably used, wherein all of $R^1$, $R^3$ and $R^5$ are functional groups represented by the formula (2). However, even when a network-like polymer is to be synthesized, $R^1$, $R^3$ and $R^5$ are not necessarily functional groups represented by the formula (2) for all borazine ring-containing compounds used as monomers. When a membrane is formed by using spin-coating and the like, homogeneous dissolution in a suitable solvent is necessary. When a network-like polymer is three-dimensionally crosslinked to high dense structure, it may cause lower solvent homogeneity or solubility of a polymer in a solvent. Therefore, it is preferable to control network degree in response to a solvent used or a borazine ring-containing compound used.

When a composition containing a borazine ring-containing compound is polymerized in network structure, workability is improved in membrane formation by using spin-coating, compared with the case using a composition containing only a borazine ring-containing compound that is not polymerized. In industrial mass production of the present invention, such effect is very useful in view of cost and productivity.

$R^2$, $R^4$ and $R^6$ bonding to nitrogen (N) composing a borazine ring, each is hydrogen atom or alkyl group. $R^2$, $R^4$ and $R^6$ may be the same or different. Alkyl group included as $R^2$, $R^4$ and $R^6$ is not explained here because it is the same as explained above as alkyl group included as $R^1$, $R^3$, $R^5$ and $R^7$.

At least one of $R^1$ to $R^6$ in the formula (1) includes hydrogen atom. When no hydrogen atom is present in $R^1$ to $R^6$, polycondensation does not proceed and a low dielectric material having sufficient mechanical strength or humidity resistance may not be formed.

By annealing a composition containing a borazine ring-containing compound represented by the formula (1) or a polymer thereof under oxygen concentration and temperature conditions specified by the present invention, dielectric constant or humidity resistance of a low dielectric material obtained can be improved largely.

A specific example of a borazine ring-containing compound represented by the formula (1) includes unsubstituted borazines; alkylamino borazines such as B,B',B''-tris(propylamino)borazine, B,B',B''-tris(hexylamino)borazine, B,B',B''-tris(methylamino)borazine, B,B',B''-tris(propylamino)-N,N',N''-trimethylborazine, etc.; alkylborazines such as mono-B-methylborazine, di-B-methylborazine, mono-N-ethylborazine, di-N-methylborazine, tri-N-propylborazine, mono-N-di-B-methylborazine, etc.

A borazine ring-containing compound is one which can be produced by known method under appropriate modification. Therefore, in the present invention, a production method for a borazine ring-containing compound is not especially limited. For example, known method described in "Yosiharu Kimura, Fiber and Industry, vol. 52, No. 8, p 341 (1996)", "Paine & Sneddon, Recent Developments in Borazine-Based Polymers", "Inorganic and Organometallic Polymers", p 359, American Chemical Society, 1994, and the like can be referenced.

A composition containing a borazine ring-containing compound may further contain other components, if necessary, within the range not to impair the effects of the present invention. For example, a polysiloxane based polymer described in JP-2002-317049A may be included. An inorganic or organic type additive such as a hardening catalyst, a wettability improver, a plasticizer, a defoaming agent, a thickener, and the like may also be included in suitable amount.

As solvents to dissolve or disperse a borazine ring-containing compound, various solvents can be used as long as they can dissolve a borazine ring-containing compound or other components, which is optionally added. For example, alcohols such as ethylene glycol, ethylene glycol monomethyl ether; aromatic hydrocarbons such as toluene, benzene, xylene, etc.; tetrahydrofuran, diglyme, tetraglyme, and the like can be used as such solvents. They may be used as a single component or in combination of two or more types.

Preferably, a solvent to dissolve or disperse a borazine ring-containing compound is represented by the following formula:

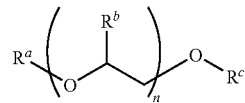

By using a solvent represented by the above-described formula as a solvent for a composition containing a borazine ring-containing compound, uniformity of a membrane formed by using a coating method is improved.

Each of $R^a$ and $R^c$ is alkyl group or acyl group. $R^a$ and $R^c$ may be the same or different. Alkyl group which can be included as $R^a$ and $R^c$ may be a straight, branched or cyclic alkyl group.

A specific example of alkyl group which can be included as $R^a$ and $R^c$ includes methyl group, ethyl group, propyl group, isopropyl group, butyl group, isobutyl group, sec-butyl group, tert-butyl group, pentyl group, neopentyl group, hexyl group, heptyl group, octyl group, nonyl group, decyl group, cyclopropyl group, cyclobutyl group, cyclopentyl group, cyclohexyl group, etc. However, alkyl group which can be included as $R^a$ and $R^c$ is not limited to these.

A specific example of acyl group which can be included as $R^a$ and $R^c$ includes formyl group, acetyl group, propionyl group, butyryl group, isobutyryl group, valeryl group, isovaleryl group, pivaloyl group, hexanoyl group, etc. However, acyl group which can be included as $R^a$ and $R^c$ is not limited to these.

$R^b$ is hydrogen atom or alkyl group. A specific example of alkyl group which can be included as $R^b$ includes methyl group, ethyl group, propyl group, isopropyl group, butyl group, isobutyl group, sec-butyl group, tert-butyl group, pentyl group, neopentyl group, hexyl group, heptyl group, octyl group, nonyl group, decyl group, cyclopropyl group, cyclobutyl group, cyclopentyl group, cyclohexyl group, etc. However, alkyl group which can be included as $R^b$ is not limited to these.

n is an integer of 1 to 5, preferably an integer of from 1 to 3, more preferably 1 or 2. When n is included in the preferable range, membrane formability and appearance of a coated membrane improve further.

When a borazine ring-containing compound is a compound represented by the above-described formula (1), and when a solvent represented by the above-described formula is used, they are effective to improve membrane formability in spin-coating and appearance of a coated membrane.

A specific example of the above-described compound preferable as a solvent includes diglyme (also called as diethylene glycol dimethyl ether), monoglyme (also called as ethylene glycol dimethyl ether), ethylene glycol monomethyl ether, ethylene glycol monoethyl ether, ethylene glycol diethyl ether, ethylene glycol monopropyl ether, ethylene glycol dipropyl ether, ethylene glycol butyl ether, ethylene glycol monoacetate, ethylene glycol diacetate, ethylene glycol methyl ether acetate, ethylene glycol ethyl ether acetate, ethylene glycol monobutyl ether acetate, propylene glycol dimethyl ether, propylene glycol methyl ether acetate, propylene glycol diacetate, diethylene glycol monomethyl ether, diethylene glycol monoethyl ether, diethylene glycol diethyl ether, diethylene glycol methyl ether acetate, diethylene glycol ethyl ether acetate, diethylene glycol diacetate, triglyme (also called as triethylene glycol dimethyl ether), triethylene glycol monomethyl ether, tetraglyme (also called as tetraethylene glycol dimethyl ether), etc. In view of membrane formability in coating and appearance of a coated membrane, a compound, among exemplified solvents, having n of integer from 1 to 3 is preferable and a compound having n of integer of 1 or 2 is more preferable in the general formula (1) representing a solvent used in the present invention as described above.

The above-described compound included as a solvent is one which can be produced by known methods under appropriate modification. A commercial compound may be used. A composition for low dielectric material of the present invention may contain two or more types of solvents. In this case, all of these two or more types of solvents may have structure represented by the above-described chemical formula specified by the present invention. Optionally, a different solvent may be used in addition to a solvent represented by the above-described chemical formula. However, in such a case, a solvent represented by the above-described chemical formula is contained preferably in the amount of not less than 25 wt % of total solvent weight.

In a composition for low dielectric material of the present invention, a solvent, a borazine ring-containing compound and optional other additives may be included. Content of each component in a composition for low dielectric material is not especially limited and optimal conditions may be selected in response to applications and practice embodiments. For example, when a composition for low dielectric material is coated by spin-coating, amount of the compounding is determined in view of uniformity of a coated membrane and economical aspect. In general, in a composition for low dielectric material, 50 to 99 wt % of a solvent and 1 to 50% of a borazine ring-containing compound is preferably contained based on total weight of a composition for low dielectric material. When they are contained within the above-described range, a low dielectric material superior in water resistance, economical aspect, humidity resistance, heat resistance, chemical resistance, mechanical strength, durability, and the like is obtained.

A composition containing a borazine ring-containing compound is fed to a place desired, dried and solidified. For example, to form an interlayer dielectric film for semiconductor device, it is coated on a substrate by spin-coating and dried. When a coated membrane with desired thickness is not obtained by one coating-and-drying step, coating-and-drying may be repeated until desired thickness is attained. Membrane formation conditions such as rotation number of a spin-coater, temperature for drying and time for drying are not especially limited.

Coating on a substrate may be performed using a method other than spin-coating. For example, spray coating, dip coating, and the like may be used. Furthermore in producing a low dielectric substrate as a bulk body, a composition containing a borazine ring-containing compound may be flowed in a template to be molded and then a molded part thus obtained is annealed. However, when the above-described preferable solvent, such as diglyme as a representative one, is used, it is preferable to use spin-coating.

Then a dried membrane is annealed under atmosphere of oxygen concentration preferably not higher than 0.1 vol %, more preferably not higher than 0.0000001 vol % (not higher than 0.1 volppm). When oxygen concentration in atmosphere is higher, dielectric constant of a low dielectric material obtained tends to become higher. It is preferable that oxygen concentration in atmosphere is as low as possible and the lower limit is not especially limited.

Oxygen concentration in the present application means oxygen concentration in atmosphere inside an annealing unit in which a coated membrane is placed. Specifically, oxygen concentration can be determined by measurement using a zirconia oxygen concentration analyzer.

Annealing temperature of a dried membrane is preferably controlled from 200 to 600° C., more preferably from 300 to 500° C. When annealing temperature is too low, humidity resistance of a low dielectric material obtained tends to be lowered. While, annealing temperature is too high, defect such as crack may generate at the surface of a low dielectric material obtained.

Annealing temperature in the present application means maximum temperature in annealing treatment. For example, when annealing temperature is gradually increased and held at 400° C. for 30 minutes, followed by cooling, "annealing temperature" is defined to be 400° C. Annealing temperature can be measured by a thermocouple. However, the means to measure annealing temperature is not especially limited.

Annealing time for a dried membrane is not especially limited. It is preferable to be determined under consideration of characteristics such as a low dielectric material obtained, such as dielectric constant, humidity resistance, and the like. It is usually about 3 to 300 minutes as period from start of temperature increase to completion of cooling.

A composition for low dielectric material of the present invention can be used, as described above, in producing a low dielectric material. And a low dielectric material of the present invention is preferably used as an interlayer dielectric film for semiconductor device. Because an interlayer dielectric film of the present invention is superior in dielectric constant, humidity resistance, and the like, it is useful to various semiconductor devices such as a LSI element, an IC substrate, etc. In particular, as an interlayer dielectric film of the present invention has low dielectric constant, it can greatly contribute to realization of high speed ULSI.

Compositions of various electronics parts such as LSI, IC, and the like are not especially limited as long as they are semiconductor device where an interlayer dielectric film of the present invention is formed. Semiconductor device having an interlayer dielectric film of the present invention is included within technical scope of the present invention.

EXAMPLES

Then, the effects of the present invention are explained using Examples. However, technical scope of the present invention is not limited to the following Examples. Synthesis 1

B,B',B"-trichloroborazine (15 g) was dissolved into sufficiently dewatered toluene (100 mL) and a mixture solution of n-propyl amine (22 g), triethyl amine (25 g) and toluene (100 mL) was dropped over 1 hour at room temperature. After completion of the drop-wise addition, the solution was stirred at 25° C. for 3 hours and further at 60° C. for 3 hours. An amine-HCl salt generated was removed by filtration, followed by removal of the solvent and unreacting amine under reduced pressure to obtain B,B',B"-tris(propylamino)borazine as yellow viscous liquid (22.5 g) (see the following scheme). Thus obtained compound was further stirred in xylene at 130° C. for 3 hours to proceed polycondensation reaction. After the reaction, the solvent is removed under reduced pressure to obtain a borazine ring-containing compound 1, as a polymer with network-like bonding of repeating units (see the following scheme).

Synthesis of B,B',B"-tris(propylamino)borazine

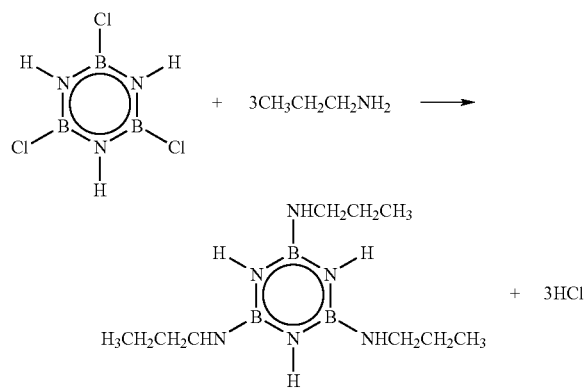

Polycondensation Reaction

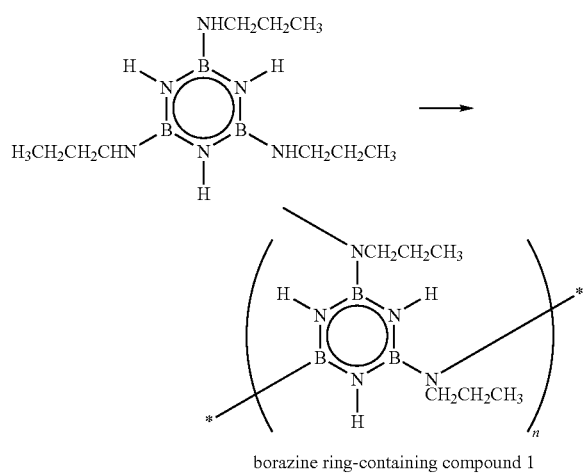

borazine ring-containing compound 1

Synthesis 2

B,B',B"-trichloroborazine (15 g) was dissolved into sufficiently dewatered toluene (100 mL) and a mixture solution of n-hexyl amine (37 g), triethyl amine (25 g) and toluene (100 mL) was dropped over 1 hour at room temperature. After completion of the drop-wise addition, the solution was stirred at 25° C. for 3 hours and further at 60° C. for 3 hours. An amine-HCl salt generated was removed by filtration, followed by removal of the solvent and unreacting amine under reduced pressure to obtain B,B',B"-tris(hexylamino)borazine as yellow viscous liquid (30 g). Thus obtained compound was further stirred in xylene at 130° C. for 3 hours to proceed polycondensation reaction. After the reaction, the solvent is removed under reduced pressure to obtain a borazine ring-containing compound 2.

Synthesis 3

B,B',B"-trichloroborazine (15 g) was dissolved into sufficiently dewatered toluene (100 mL) and dropped over 1 hour into a flask containing methyl amine (16 g), held at about −70° C. After completion of the drop-wise addition, the solution was stirred at 25° C. for 3 hours and further at 60° C. for 3 hours. An amine-HCl salt generated was removed by filtration, followed by removal of the solvent and unreacting amine under reduced pressure to obtain B,B',B"-tris(methylamino)borazine as white viscous liquid (12 g). Thus obtained compound was further stirred in xylene at 130° C. for 3 hours to proceed polycondensation reaction. After the reaction, the solvent is removed under reduced pressure to obtain a borazine ring-containing compound 3.

Synthesis 4

B,B',B"-trichloro-N,N',N"-trimethylborazine (15 g) was dissolved into sufficiently dewatered toluene (100 mL) and a mixture solution of n-propyl amine (14 g), triethyl amine (23 g) and toluene (100 mL) was dropped over 1 hour at room temperature. After completion of the drop-wise addition, the solution was stirred at 25° C. for 3 hours and further at 60° C. for 3 hours. An amine-HCl salt generated was removed by filtration, followed by removal of the solvent and unreacting amine under reduced pressure to obtain B,B',B"-tris(propylamino)-N,N',N"-trimethylborazine as yellow viscous liquid (17 g). Thus obtained compound was further stirred in xylene at 130° C. for 3 hours to proceed polycondensation reaction. After the reaction, the solvent is removed under reduced pressure to obtain a borazine ring-containing compound 4.

1. Study on the Effects of Annealing Conditions

Example 1

The borazine ring-containing compound 1 obtained in Synthesis 1 was dissolved in sufficiently dried xylene to obtain a solution of 10 wt % of the borazine ring-containing compound. This solution was coated on a silicon substrate using a spin-coater at 3000 rpm, followed by drying at 120° C. for 3 minutes. By repeating this operation 8 times, a coated membrane with thickness of 1 μm was obtained. This membrane was annealed at 350° C. for 30 minutes under argon atmosphere with oxygen concentration not higher than 0.1 ppm to form a transparent coated membrane 1 without any crack. To the coated membrane 1, a gold electrode was vapor deposited to measure dielectric constant of the membrane. Humidity resistance of the membrane was also evaluated. Results are shown in Table 1.

Humidity resistance was evaluated by observation of appearance change at 20° C. and 20% RH conditions based on the following criteria:
  ⊚: no change for 2 days or more
  ○: change in 1 to 2 days
  x: change within 1 day.

Example 2

A coated membrane 2 was formed in accordance with procedure in Example 1 except that a borazine ring-containing compound 2 obtained in Synthesis 2 was used. Measurement results of dielectric constant and humidity resistance of the coated membrane 2 are shown in Table 1.

Example 3

A coated membrane 3 was formed in accordance with procedure in Example 1 except that the borazine ring-containing compound 3 obtained in Synthesis 3 was used. Measurement results of dielectric constant and humidity resistance of the coated membrane 3 are shown in Table 1.

Example 4

A coated membrane 4 was formed in accordance with procedure in Example 1 except that the borazine ring-containing compound 4 obtained in Synthesis 4 was used. Measurement results of dielectric constant and humidity resistance of the coated membrane 4 are shown in Table 1.

Example 5

A coated membrane 5 was formed in accordance with procedure in Example 1 except that annealing temperature was set at 550° C. Measurement results of dielectric constant and humidity resistance of the coated membrane 5 are shown in Table 1.

Example 6

A coated membrane 6 was formed in accordance with procedure in Example 2 except that annealing temperature was set at 550° C. Measurement results of dielectric constant and humidity resistance of the coated membrane 6 are shown in Table 1.

Example 7

A coated membrane 7 was formed in accordance with procedure in Example 3 except that annealing temperature was set at 550° C. Measurement results of dielectric constant and humidity resistance of the coated membrane 7 are shown in Table 1.

Example 8

A coated membrane 8 was formed in accordance with procedure in Example 4 except that annealing temperature was set at 550° C. Measurement results of dielectric constant and humidity resistance of the coated membrane 8 are shown in Table 1.

Example 9

A coated membrane 9 was formed in accordance with procedure in Example 1 except that annealing temperature was set at 200° C. Measurement results of dielectric constant and humidity resistance of the coated membrane 9 are shown in Table 1.

Example 10

A coated membrane 10 was formed in accordance with procedure in Example 2 except that annealing temperature was set at 200° C. Measurement results of dielectric constant and humidity resistance of the coated membrane 10 are shown in Table 1

Example 11

A coated membrane 11 was formed in accordance with procedure in Example 3 except that annealing temperature was set at 200° C. Measurement results of dielectric constant and humidity resistance of the coated membrane 11 are shown in Table 1

Example 12

A coated membrane 12 was formed in accordance with procedure in Example 4 except that annealing temperature was set at 200° C. Measurement results of dielectric constant and humidity resistance of the coated membrane 12 are shown in Table 1

Comparative Example 1

A coated membrane 13 was formed in accordance with procedure in Example 1 except that annealing was performed under oxygen concentration of 20%. Measurement results of dielectric constant and humidity resistance of the coated membrane 13 are shown in Table 1.

Comparative Example 2

A coated membrane 14 was formed in accordance with procedure in Example 2 except that annealing was performed under oxygen concentration of 20%. Measurement results of dielectric constant and humidity resistance of the coated membrane 14 are shown in Table 1.

Comparative Example 3

A coated membrane 15 was formed in accordance with procedure in Example 3 except that annealing was performed under oxygen concentration of 20%. Measurement results of dielectric constant and humidity resistance of the coated membrane 15 are shown in Table 1.

Comparative Example 4

A coated membrane 16 was formed in accordance with procedure in Example 4 except that annealing was performed under oxygen concentration of 20%. Measurement results of dielectric constant and humidity resistance of the coated membrane 16 are shown in Table 1.

Comparative Example 5

A coated membrane 17 was formed in accordance with procedure in Example 1 except that annealing temperature was set at 150° C. Measurement results of dielectric constant and humidity resistance of the coated membrane 17 are shown in Table 1.

Comparative Example 6

A coated membrane 18 was formed in accordance with procedure in Example 2 except that annealing temperature was set at 150° C. Measurement results of dielectric constant and humidity resistance of the coated membrane 18 are shown in Table 1.

Comparative Example 7

A coated membrane 19 was formed in accordance with procedure in Example 3 except that annealing temperature was set at 150° C. Measurement results of dielectric constant and humidity resistance of the coated membrane 19 are shown in Table 1.

Comparative Example 8

A coated membrane 20 was formed in accordance with procedure in Example 4 except that annealing temperature was set at 150° C. Measurement results of dielectric constant and humidity resistance of the coated membrane 20 are shown in Table 1.

Comparative Example 9

A coated membrane 21 was formed in accordance with procedure in Example 1 except that annealing temperature was set at 700° C. Measurement results of dielectric constant and humidity resistance of the coated membrane 21 are shown in Table 1.

Comparative Example 10

A coated membrane 22 was formed in accordance with procedure in Example 2 except that annealing temperature was set at 700° C. Measurement results of dielectric constant and humidity resistance of the coated membrane 22 are shown in Table 1.

Comparative Example 11

A coated membrane 23 was formed in accordance with procedure in Example 3 except that annealing temperature was set at 700° C. Measurement results of dielectric constant and humidity resistance of the coated membrane 23 are shown in Table 1.

Comparative Example 12

A coated membrane 24 was formed in accordance with procedure in Example 4 except that annealing temperature was set at 700° C. Measurement results of dielectric constant and humidity resistance of the coated membrane 24 are shown in Table 1.

TABLE 1

| | Coated membrane | Borazine ring-containing compound | Annealing atmosphere | Annealing temperature | Dielectric constant | Humidity resistance |
|---|---|---|---|---|---|---|
| example 1 | 1 | 1 | Argon | 350° C. | 2.5 | ⊚ |
| example 2 | 2 | 2 | Argon | 350° C. | 2.4 | ⊚ |
| example 3 | 3 | 3 | Argon | 350° C. | 2.3 | ⊚ |
| example 4 | 4 | 4 | Argon | 350° C. | 2.3 | ⊚ |
| example 5 | 5 | 1 | Argon | 550° C. | 2.8 | ⊚ |
| example 6 | 6 | 2 | Argon | 550° C. | 2.7 | ⊚ |
| example 7 | 7 | 3 | Argon | 550° C. | 2.7 | ⊚ |
| example 8 | 8 | 4 | Argon | 550° C. | 2.8 | ⊚ |
| example 9 | 9 | 1 | Argon | 200° C. | 2.5 | ○ |
| example 10 | 10 | 2 | Argon | 200° C. | 2.3 | ○ |
| example 11 | 11 | 3 | Argon | 200° C. | 2.3 | ○ |
| example 12 | 12 | 4 | Argon | 200° C. | 2.2 | ○ |
| comparative example 1 | 13 | 1 | Air | 350° C. | 3.3 | ○ |
| comparative example 2 | 14 | 2 | Air | 350° C. | 3.2 | ○ |
| comparative example 3 | 15 | 3 | Air | 350° C. | 3.5 | ○ |
| comparative example 4 | 16 | 4 | Air | 350° C. | 5.6 | ○ |
| comparative example 5 | 17 | 1 | Argon | 150° C. | — | X |
| comparative example 6 | 18 | 2 | Argon | 150° C. | — | X |
| comparative example 7 | 19 | 3 | Argon | 150° C. | — | X |
| comparative example 8 | 20 | 4 | Argon | 150° C. | — | X |
| comparative example 9 | 21 | 1 | Argon | 700° C. | Crack | — |
| comparative example 10 | 22 | 2 | Argon | 700° C. | Crack | — |
| comparative example 11 | 23 | 3 | Argon | 700° C. | Crack | — |
| comparative example 12 | 24 | 4 | Argon | 700° C. | Crack | — |

As shown by Comparative Examples 1 to 4 (coated membranes 13 to 16), when oxygen concentration in annealing atmosphere was high, dielectric constant of low dielectric materials obtained increased. As shown by Comparative Examples 5 to 8 (coated membranes 17 to 20), when annealing temperature was low, humidity resistance of low dielectric materials obtained was insufficient. The low dielectric materials obtained did not show function as low dielectric materials due to hydrolysis of coated membranes by moisture in atmosphere. As shown by Comparative Examples 9 to 12 (coated membranes 21 to 24), when annealing temperature was high, crack generated in low dielectric materials obtained. A part of low dielectric materials was found to be peeled from a substrate. While, low dielectric materials of the present invention had low dielectric constant and were also superior in humidity resistance.

Thus, by controlling annealing conditions, a low dielectric material having low dielectric constant and also high humidity resistance can be obtained.

2. Study on the Effects of a Solvent

Example 13

The borazine ring-containing compound 1 obtained in Synthesis 1 was dissolved in sufficiently dried diglyme to obtain a composition for low dielectric material containing 10 wt % of the borazine ring-containing compound. This composition for low dielectric material obtained was coated on a silicon substrate using a spin-coater at 3000 rpm, followed by drying at 120° C. for 3 minutes. By repeating this operation 8 times, a coated membrane with thickness of 1 μm was obtained. This membrane was annealed at 350° C. for 30 minutes under argon atmosphere with oxygen concentration not higher than 0.1 ppm to form a transparent coated membrane 25 without any crack. The coated membrane 25 was uniform and appearance was also good. To the coated membrane obtained, a gold electrode was vapor deposited to measure dielectric constant of the membrane. Measurement results are shown in Table 2.

Example 14

A coated membrane 26 was formed in accordance with procedure in Example 13 except that a borazine ring-containing compound 2 obtained in Synthesis 2 was used. The coated membrane 26 was uniform and appearance was good. Measurement results of appearance and dielectric constant of the coated membrane 26 are shown in Table 2.

Example 15

A coated membrane 27 was formed in accordance with procedure in Example 13 except that a borazine ring-containing compound 3 obtained in Synthesis 3 was used. The coated membrane 27 was uniform and appearance was good. Measurement results of appearance and dielectric constant of the coated membrane 27 are shown in Table 2.

Example 16

A coated membrane 28 was formed in accordance with procedure in Example 13 except that a borazine ring-containing compound 4 obtained in Synthesis 4 was used. The coated membrane 28 was uniform and appearance was good. Measurement results of appearance and dielectric constant of the coated membrane 28 are shown in Table 2.

Comparative Example 13

A coated membrane 29 was formed in accordance with procedure in Example 13 except that toluene was used as a solvent instead of diglyme. The coated membrane 29 showed white turbid state. The coated membrane 29 was also an unsatisfactory membrane because streak or convex points were formed at the surface.

Comparative Example 14

A coated membrane 30 was formed in accordance with procedure in Example 14 except that tetrahydrofuran (THF) was used as a solvent instead of diglyme. The coated membrane 30 showed white turbid state. The coated membrane 30 was also an unsatisfactory membrane because streak or convex points were formed at the surface.

Comparative Example 15

A coated membrane 31 was formed in accordance with procedure in Example 15 except that toluene was used as a solvent instead of diglyme. The coated membrane 31 showed white turbid state. The coated membrane 31 was also an unsatisfactory membrane because streak or convex points were formed at the surface.

Comparative Example 16

A coated membrane 32 was formed in accordance with procedure in Example 16 except that ethanol was used as a solvent instead of diglyme. The coated membrane 32 showed white turbid state. The coated membrane 32 was also an unsatisfactory membrane because streak or convex points were formed at the surface.

TABLE 2

| Coated membrane | Borazine ring containing compound | Solvent | Appearance of coated membrane | Dielectric constant |
|---|---|---|---|---|
| example 13 | 25 | 1 | Diglyme | Transparent, Good | 2.5 |
| example 14 | 26 | 2 | Diglyme | Transparent, Good | 2.6 |
| example 15 | 27 | 3 | Diglyme | Transparent, Good | 2.3 |
| example 16 | 28 | 4 | Diglyme | Transparent, Good | 2.5 |
| comparative example 13 | 29 | 1 | Toluene | Turbid, poor | — |
| comparative example 14 | 30 | 2 | THF | Turbid, poor | — |
| comparative example 15 | 31 | 3 | Toluene | Turbid, poor | — |
| comparative example 16 | 32 | 4 | Ethanol | Turbid, poor | — |

As shown by Table 2, when a solvent specified by the present invention was used as a solvent for a borazine ring-containing compound, a superior coated membrane without any trouble such as white turbidity was obtained.

Thus, by using a composition for low dielectric material containing a solvent having structure represented by the above-described formula, a uniform coated membrane is formed. For example, when an interlayer dielectric film for semiconductor device is produced by using a composition of the present invention, reliability of semiconductor device produced is improved. Furthermore, by using a composition of the present invention, improvement of production yield for semiconductor device is expected, which can greatly contribute in industrial mass production step.

What is claimed is:

1. A low dielectric material obtained by coating a composition for low dielectric material on a substrate, wherein said composition comprises:

a compound represented by the following formula (1) or a polymer thereof:

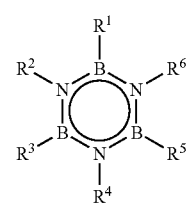

(1)

wherein $R^1$, $R^3$ and $R^5$ independently represents a group represented by the following formula (2):

(2)

wherein $R^7$ is alkyl group; $R^2$, $R^4$ and $R^6$ independently represents hydrogen atom, or alkyl group; and at least one of $R^2$, $R^4$ and $R^6$ is hydrogen atom; and a solvent represented by the following formula:

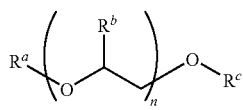

wherein $R^a$ and $R^c$ independently represents alkyl group or acyl group; $R^b$ represents hydrogen atom or alkyl group; and n represents an integer of 2 to 3, wherein said low dielectric material is a transparent film.

2. The low dielectric material of claim 1 wherein $R^a$ and $R^c$ are methyl and $R^b$ is a hydrogen atom.

3. The low dielectric material of claim 1 wherein the solvent is triglyme.

4. A low dielectric material obtained by coating a composition for low dielectric material on a substrate, wherein said composition comprises:

a compound represented by the following formula (1) or a polymer thereof:

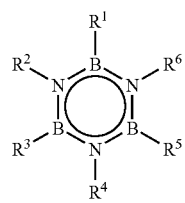

(1)

wherein $R^1$, $R^3$ and $R^5$ independently represents a group represented by the following formula (2):

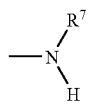

(2)

wherein $R^7$ is alkyl group; $R^2$, $R^4$ and $R^6$ independently represents hydrogen atom, or alkyl group; and at least one of $R^2$, $R^4$ and $R^6$ is hydrogen atom; and a solvent represented by the following formula:

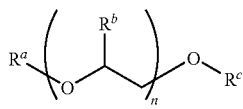

wherein $R^a$ and $R^c$ independently represents alkyl group or acyl group; $R^b$ represents hydrogen atom or alkyl group; wherein said low dielectric material is a transparent film wherein said solvent is diglyme.

5. A method for production of a low dielectric material, comprising a process of forming a coated membrane on a substrate by spin-coating a composition comprising:

a compound represented by the following formula (1) or a polymer thereof:

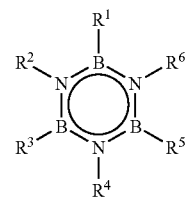

(1)

wherein $R^1$, $R^3$ and $R^5$ independently represents a group represented by the following formula (2):

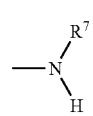

(2)

wherein $R^7$ is alkyl group; $R^2$, $R^4$ and $R^6$ independently represents hydrogen atom, or alkyl group; and at least one of $R^2$, $R^4$ and $R^6$ is hydrogen atom; and a solvent represented by the following formula:

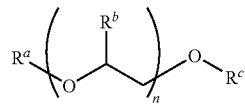

wherein $R^a$ and $R^c$ independently represents alkyl group or acyl group; $R^b$ represents hydrogen atom or alkyl group; and n represents an integer of 2 to 3, wherein said low dielectric material is a transparent film.

6. The method of claim 5 wherein the solvent is diglyme.

7. The method of claim 5 wherein the solvent is triglyme.

* * * * *